(12) United States Patent
Yang et al.

(10) Patent No.: US 11,778,762 B2
(45) Date of Patent: Oct. 3, 2023

(54) DISPLAY ASSEMBLY AND VEHICLE HAVING THE SAME

(71) Applicant: BOE TECHNOLOGY GROUP CO., LTD., Beijing (CN)

(72) Inventors: Yanyan Yang, Beijing (CN); Shangchieh Chu, Beijing (CN); Xiaofei Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 356 days.

(21) Appl. No.: 17/259,379

(22) PCT Filed: Mar. 26, 2020

(86) PCT No.: PCT/CN2020/081392
§ 371 (c)(1),
(2) Date: Jan. 11, 2021

(87) PCT Pub. No.: WO2021/189352
PCT Pub. Date: Sep. 30, 2021

(65) Prior Publication Data
US 2022/0141976 A1     May 5, 2022

(51) Int. Cl.
*B60R 11/02*     (2006.01)
*H05K 5/02*     (2006.01)
(Continued)

(52) U.S. Cl.
CPC ........... *H05K 5/0217* (2013.01); *B60K 35/00* (2013.01); *B60R 11/0229* (2013.01);
(Continued)

(58) Field of Classification Search
None
See application file for complete search history.

(56) References Cited

U.S. PATENT DOCUMENTS 7,198,393 B2 * 4/2007 Tubidis ................. B60K 35/00
                                                    313/511
9,272,671 B2 * 3/2016 Vander Sluis ...... B60R 11/0235
(Continued)

FOREIGN PATENT DOCUMENTS

CN     205656418     12/1899
CN     210039142     12/1899
(Continued)

OTHER PUBLICATIONS

PCT International Search Report for corresponding PCT Application No. PCT/CN2020/081392, dated Dec. 25, 2020, 11 pages.
(Continued)

*Primary Examiner* — Xanthia C Cunningham
(74) *Attorney, Agent, or Firm* — Dority & Manning, P.A.

(57) ABSTRACT

A display assembly includes a storage box and a flexible display screen. A storage groove is formed in the storage box and a side of the storage groove is open. The flexible display screen is able to be switched between an unfolded state and a folded state. In the unfolded state, the flexible display screen is unfolded and covers an open side of the storage groove, and in the folded state, the flexible display screen is folded or wound, and the open side of the storage groove is at least partially exposed.

14 Claims, 3 Drawing Sheets

(51) Int. Cl.
  *B60K 35/00*      (2006.01)
  *H05K 5/00*       (2006.01)
  *B60R 11/00*      (2006.01)

(52) U.S. Cl.
  CPC .... *H05K 5/0017* (2013.01); *B60K 2370/1533* (2019.05); *B60K 2370/67* (2019.05); *B60K 2370/774* (2019.05); *B60R 2011/0007* (2013.01); *B60R 2011/0014* (2013.01)

(56) References Cited

U.S. PATENT DOCUMENTS

| | | | | |
|---|---|---|---|---|
| 9,933,820 | B2* | 4/2018 | Hélot | G06F 1/1643 |
| 11,102,339 | B2* | 8/2021 | Ahn | G06F 1/1601 |
| 11,292,343 | B2* | 4/2022 | Kumar | C03C 3/091 |
| 2007/0136405 | A1* | 6/2007 | Weinstein | G06F 15/0216 |
| | | | | 708/130 |
| 2008/0100548 | A1* | 5/2008 | Choi | B60R 11/0235 |
| | | | | 345/87 |
| 2012/0268665 | A1* | 10/2012 | Yetukuri | B60N 2/879 |
| | | | | 348/837 |
| 2015/0002991 | A1 | 1/2015 | Vander Sluis | |
| 2016/0081204 | A1* | 3/2016 | Park | G06F 1/1652 |
| | | | | 361/807 |
| 2016/0259365 | A1* | 9/2016 | Wang | H05K 5/0217 |
| 2017/0217290 | A1* | 8/2017 | Yoshizumi | G09G 3/001 |
| 2017/0262057 | A1* | 9/2017 | Knittl | B60K 35/00 |
| 2020/0314225 | A1* | 10/2020 | Ahn | G06F 1/1652 |
| 2020/0331348 | A1 | 10/2020 | Feng et al. | |

FOREIGN PATENT DOCUMENTS

| | | |
|---|---|---|
| CN | 102956161 | 3/2013 |
| CN | 210181960 U | 3/2020 |
| CN | 210073063 | 12/2020 |
| FR | 2877293 A1 | 5/2006 |
| KR | 100818170 B1 | 4/2008 |
| WO | WO2018/006751 A1 | 1/2018 |
| WO | WO2018/006763 A1 | 1/2018 |

OTHER PUBLICATIONS

Chinese Office Action (w/ English translation) for corresponding Chinese Application No. 202080000395.9, dated Mar. 23, 2023, 16 pages.

* cited by examiner

DISPLAY ASSEMBLY AND VEHICLE HAVING THE SAME

CROSS-REFERENCE TO RELATED APPLICATION

This application is a national phase entry under 35 USC 371 of International Patent Application No. PCT/CN2020/081392 filed on Mar. 26, 2020, which is incorporated herein by reference in its entirety.

TECHNICAL FIELD

The present application relates to the field of flexible display technologies, and in particular, to a display assembly and a vehicle having the same.

BACKGROUND

In the related art, it points out that with the vigorous development of the automobile industry, the vehicle-mounted display has developed rapidly. Vehicle-mounted devices can be used to display driving data information, navigation maps, Internet information, and audio-visual entertainment information, etc., thereby improving user experience. Compared with traditional display screens, flexible display screens have the advantages of low power consumption, small size, excellent picture quality, and flexible display, etc. Applying flexible display to a vehicle-mounted display device can undoubtedly further improve the user experience. With the gradual increase in the internal functions design of a vehicle, there is less and less space available in the vehicle. Therefore, how to rationally design the vehicle-mounted display device and effectively utilize the space inside the vehicle is one of the problems that need to be studied currently for the vehicle-mounted display.

SUMMARY

The present application aims to at least solve one of the technical problems existing in the prior art. For this reason, the present application provides a display assembly. The display assembly has a high degree of integration, and the space in a vehicle is able to be effectively utilized.

The application further provides a vehicle having the display assembly.

The display assembly according to embodiments of the present application includes a storage box and a flexible display screen. A storage groove is formed in the storage box and a side of the storage groove is open. The flexible display screen is able to be switched between an unfolded state and a folded state. In the unfolded state, the flexible display screen is unfolded and covers an open side of the storage groove; in the folded state, the flexible display screen is folded or wound, and the open side of the storage groove is at least partially exposed.

According to the display assembly in the embodiments of the present application, by integrating the storage box and the flexible display screen together, personal belongings of the passengers may be stored in the storage box, and the flexible display screen may be used to display vehicle condition information, traffic information and entertainment information, etc. The display assembly has a high degree of function integration, a small size, and a reasonable design, and the space in the vehicle may be effectively utilized.

According to some embodiments of the present application, the storage box has a first end and a second end that are oppositely disposed. The flexible display screen includes a reel and a flexible screen. The reel is rotatably disposed at the first end of the storage box. The flexible screen is able to be wound on the reel. The flexible screen has a fixed end and a moving end that are opposite in a length direction thereof, the fixed end of the flexible screen is fixed on the reel, and the moving end of the flexible screen is movable. The flexible display screen is in the folded state, and the flexible screen is wound on the reel. The flexible display screen is in the unfolded state, and the moving end of the flexible screen moves to the second end of the storage box.

According to some embodiments of the present application, the flexible display screen further includes a winding drum, the winding drum is arranged outside the reel, and the reel rotates relative to the winding drum.

According to some embodiments of the present application, the winding drum includes an opening extending along an axial direction of the winding drum, and the moving end of the flexible screen extends out of the winding drum from the opening.

According to some embodiments of the present application, a distance exists between an inner wall of the winding drum and an outer side of at least a part of the flexible screen in the winding drum.

According to some embodiments of the present application, the display assembly includes a driving apparatus. The driving apparatus is connected to the flexible display screen for driving the flexible display screen to switch between the unfolded state and the folded state.

According to some embodiments of the present application, the driving apparatus includes a motor, a screen fixing member and a transmission member. The moving end of the flexible screen is fixed on the screen fixing member. The transmission member is connected to the motor and the screen fixing member, and the motor drives the screen fixing member to move in a straight line through the transmission member.

According to some embodiments of the present application, the transmission member includes a lead screw and a sliding block. The lead screw extends along a direction from the first end of the storage box to the second end of the storage box, and the lead screw is connected to the motor. The sliding block is movably arranged on the lead screw along a length direction of the lead screw and engages with the lead screw for transmission, and the screen fixing member and the sliding block are relatively fixed.

According to some embodiments of the present application, the transmission member further includes a supporting frame. The supporting frame has a first supporting plate and a second supporting plate that are spaced apart in the direction from the first end of the storage box to the second end of the storage box. Both ends of the lead screw are rotatably supported on the first supporting plate and the second supporting plate, the motor is disposed at an outer side of the first supporting plate or the second supporting plate in the direction from the first end of the storage box to the second end of the storage box, and the sliding block is located between the first supporting plate and the second supporting plate.

According to some embodiments of the present application, a connection plane is formed on the screen fixing member, and the moving end of the flexible screen is bonded to the connection plane.

According to some embodiments of the present application, a sliding part is disposed on the screen fixing member, and the screen fixing member is slidable along the direction from the first end of the storage box to the second end of the storage box and disposed at the open side of the storage box.

According to some embodiments of the present application, the sliding part is formed as a sliding groove or a sliding rail, and the sliding part is used for slidably engaging with a side wall of the storage box.

According to some embodiments of the present application, the display assembly further includes a reset member. The reset member is connected to the reel, and the reset member has a force that pushes the flexible display screen to switch from the unfolded state to the folded state.

According to some embodiments of the present application, the reset member is a torsion spring. The torsion spring is arranged on the reel, the torsion spring has a positioning end and a torsion end that are opposite in an axial direction of the torsion spring, the positioning end of the torsion spring is fixed, and the torsion end of the torsion spring is connected to the reel.

According to some embodiments of the present application, the display assembly is disposed in a center console of a vehicle or at a position of an armrest between a driver seat and a front passenger seat.

A vehicle according to embodiments of the present application includes the display assembly according to the embodiments the present application, and the display assembly is disposed in the center console of the vehicle or at the position of the armrest between the driver seat and the front passenger seat.

According to the vehicle in the embodiments of the present application, by providing the display assembly in the first aspect to the vehicle, which has high function integration, a small size, a reasonable design, and the space in the vehicle may be effectively utilized.

Additional aspects and advantages of the present application will be given in the following descriptions, part of which will be more clear from the following descriptions, or will be known through practice of the present application.

REFERENCE SIGNS

Figure 1:
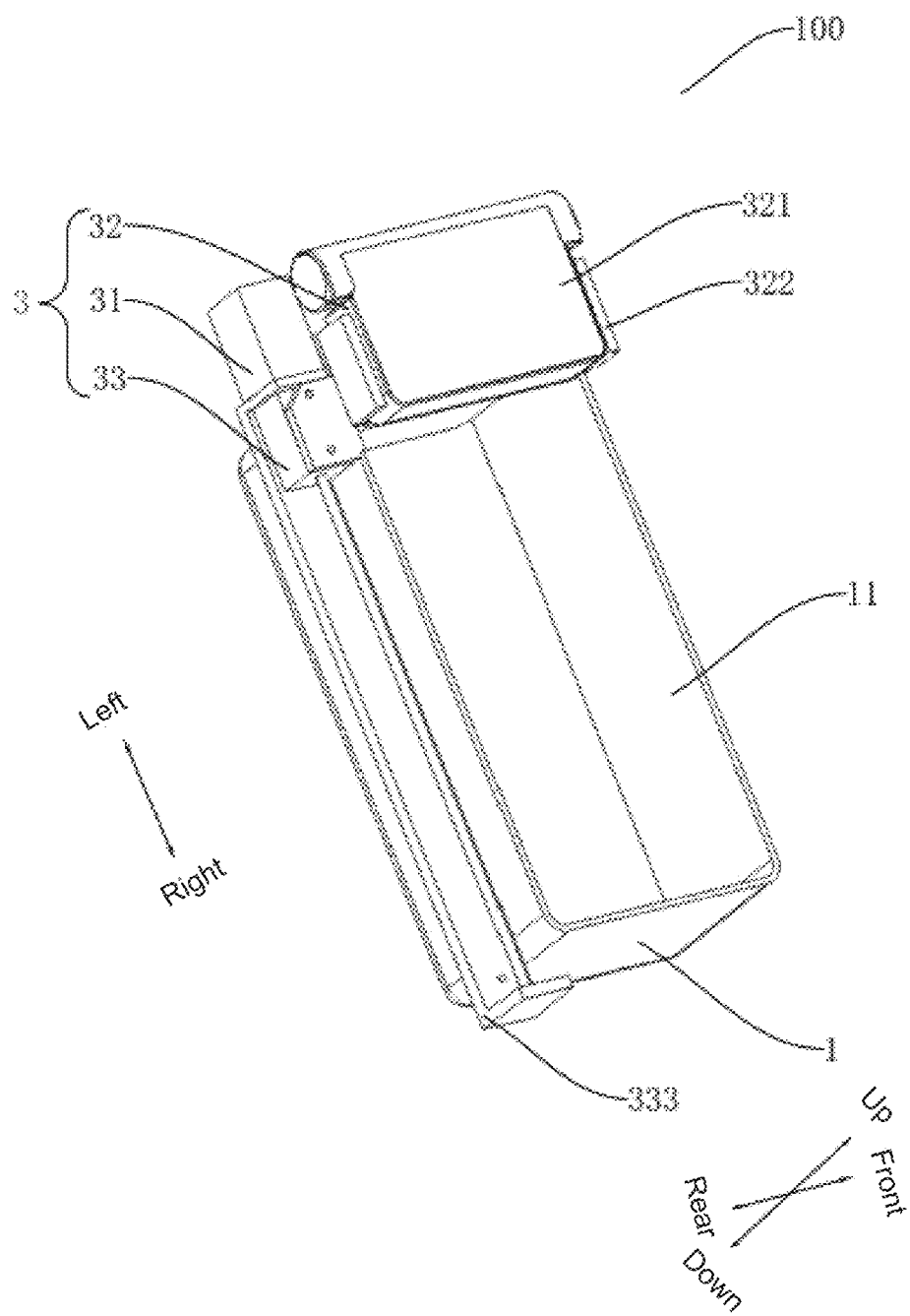
FIG. 1 is a schematic diagram of a display assembly in a folded state, according to the embodiments of the present application.

Display assembly 100:
Storage box 1, Storage groove 11,
Flexible display screen 2, Reel 21, Flexible screen 22, Winding drum 23,
Driving apparatus 3, Motor 31, Screen fixing member 32, Connection plane 321, Sliding part 322,
Transmission member 33, Lead screw 331, Sliding block 332, Supporting frame 333, First supporting plate 3331, Second supporting plate 3332,
Reset member 4, Torsion spring 41.

DETAILED DESCRIPTION

The embodiments of the present application are described below in detail. Examples of the embodiments are illustrated in accompanying drawings, and consistently, same or similar marks indicate same or similar elements, or elements with same or similar functions. The embodiments described below with reference to the accompanying drawings are explanatory for the purpose of explaining the present application, and shall not be regarded as limitations on the present application.

First of all, a vehicle according to embodiments of a second aspect of the present application will be described briefly with reference to FIGS. 1 to 4. The vehicle includes a display assembly 100 according to embodiments of a first aspect of the present application. The display assembly 100 is disposed in a center console of the vehicle or at a position of an armrest between a driver seat and a front passenger seat.

The display assembly 100 according to the embodiments of the first aspect of the present application will be described below with reference to FIGS. 1 and 2.

As shown in FIG. 1, the display assembly 100 according to the embodiments of the first aspect of the present application includes: a storage box 1 and a flexible display screen 2. A storage groove 11 is formed in the storage box 1, and a side of the storage groove 11 is open. The storage groove 11 may be used to store items carried by passengers.

The flexible display screen 2 may be switched between an unfolded state and a folded state. In the unfolded state, the flexible display screen 2 is unfolded and covers the open side of the storage groove 11; and in the folded state, the flexible display screen 2 is folded or wound, and the open side of the storage groove 11 is at least partially exposed.

In other words, the storage box 1 of the display assembly 100 in the embodiments of the present application may be used to store the items carried by the passengers, and the flexible display screen 2 disposed above the storage box 1 has the unfolded state and the folded state. As shown in FIGS. 1 and 2, in the unfolded state, the flexible display screen 2 may cover the storage groove 11; and in the folded state, the storage groove 11 at the rear of the flexible display screen 2 may be exposed. Therefore, the display assembly 100 may combine a display function and a storage function, and have a high degree of function integration, a small size, and a reasonable design, and the space in the vehicle may be effectively utilized.

When the display assembly 100 is disposed at a position of the center console of the vehicle, and the flexible display 2 is in the unfolded state, it is possible to display vehicle condition information and traffic information for a driver at a driving seat, or display entertainment information and traffic information for a passenger at a front seat. Alternatively, when the display assembly 100 is disposed at the position of the armrest between the driver seat and the front passenger seat, for example, specifically, it may be disposed on a rear of the armrest, and the flexible display screen 2 is disposed on an opening of the storage groove 11. In this case, when the flexible display screen 2 is in the unfolded state, it can be used to display entertainment information and traffic information to rear-seat passengers.

According to the display assembly 100 in the embodiments of the present application, by integrating the storage box 1 and the flexible display screen 2 together, personal belongings of the passengers may be stored in the storage box 1, and the flexible display screen may be used to display vehicle condition information, traffic information and entertainment information, etc. Thus, the display assembly 100 has the high degree of function integration, the small size and the reasonable design, and the space in the vehicle may be effectively utilized.

Figure 2:
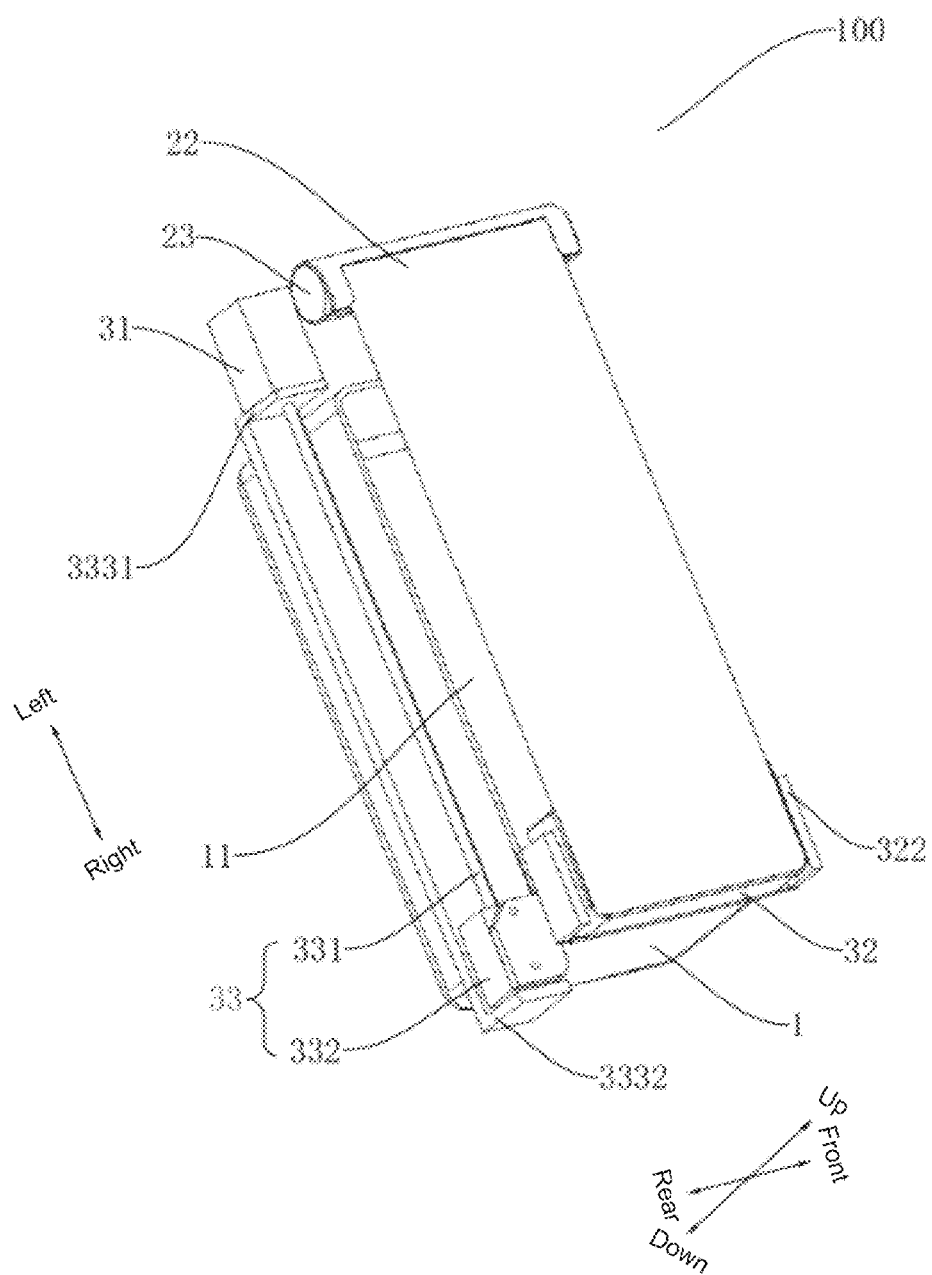
FIG. 2 is a schematic diagram of a display assembly in an unfolded state, according to the embodiments of the present application.

In an embodiment of the present application, as shown in FIG. 2, the storage box has a first end and a second end that are oppositely disposed in a left-right direction. The flexible display screen 2 may include: a reel 21 and a flexible screen 22 that may be wound on the reel 21. The reel 21 is rotatably disposed at the first end of the storage box 1 (e.g., a left end of the storage box 1 shown in FIG. 2); and the flexible screen has a fixed end and a moving end that are opposite in a length direction thereof, the fixed end of the flexible screen 22 (e.g., a left end of the flexible screen 22 shown in FIG. 2) is fixed on the reel 21, and the moving end of the flexible screen 22 (e.g., a right end of the flexible screen 22 shown in FIG. 2) is movable.

Therefore, when the flexible display screen 2 is in the folded state, the flexible screen 22 is wound on the reel 21, and the flexible screen 22 occupies a small volume in the vehicle when not in use; and when the flexible display screen 2 is in the unfolded state, the moving end of the flexible screen 22 (e.g., the right end of the flexible screen 22 shown in FIG. 2) moves to the second end of the storage box 1 (e.g., a right end of the storage box 1 shown in FIG. 2), which may display vehicle condition information, traffic information and entertainment information, etc. for users.

Further, for example, as shown in FIG. 2, the flexible display screen 2 may further include a winding drum 23. The winding drum 23 is arranged outside the reel 21, and the reel 21 may rotate relative to the winding drum 23. A strip-shaped opening extending along an axial direction of the winding drum is formed in the winding drum 23, and the moving end of the flexible screen 22 (e.g., the right end of the flexible screen 22 shown in FIG. 2) extends out of the winding drum 23 from the strip-shaped opening, and there is a certain distance between the inner wall of the winding drum 23 and the outer side of the flexible screen 22 wound in the winding drum. When the flexible screen 22 needs to be wound on the reel 21, the flexible screen 22 is retracted into the winding drum 23 through the strip-shaped opening in the winding drum 23 and is wound on the reel 21. There is a certain distance between the inner wall of the winding drum 23 and a portion of the flexible screen 22 that is wound on the reel 21, so that the portion of the flexible screen 22 that is wound on the reel may be stored in the storage space in the winding drum 23. It is therefore possible to reduce damage of dust to the flexible screen 22, and effectively protect the flexible screen 22 from damage.

In some embodiments, as shown in FIGS. 1 and 2, the display assembly 100 according to the embodiments of the present application further includes a driving apparatus 3. The driving apparatus 3 is connected to the flexible display screen 2, and may drive the flexible display screen 2 to switch between the unfolded state and the folded state. It is therefore possible to realize the folded state of the flexible display screen 2 when not in use or when items in the storage groove 11 are placed and taken, and realize the unfolded state of the flexible display screen 2 when in use.

As shown in FIG. 1, the driving apparatus 3 includes a motor 31, a screen fixing member 32 and a transmission member 33. The moving end of the flexible screen 22 (e.g., the right end of the flexible screen 22 shown in FIG. 2) is fixed on the screen fixing member 32, the transmission member 33 is connected to the motor 31 and the screen fixing member 32, and the motor 31 drives the screen fixing member 32 to move along a straight line through the transmission member 33. That is, the moving end of the flexible screen 22 (e.g., the right end of the flexible screen 22 shown in FIG. 2) is fixed on the screen fixing member 32, the screen fixing member 32 is connected to the transmission member 33, the motor 31 is also connected to the transmission member 33, and a linear movement of the screen fixing member 32 is completed relying on the motor 31 driving the transmission member 33. It is therefore possible to drive the flexible display screen 2 to switch between the unfolded state and the folded state.

Further, as shown in FIG. 2, the transmission member 33 includes a lead screw 331 and a sliding block 332. The lead screw 331 extends along a length direction of the storage box 1, and the lead screw 331 is connected to the motor 31. For example, as shown in FIG. 2, a left end of the lead screw 331 is connected to the motor 31. The sliding block 332 is movably arranged on the lead screw 331 along a length direction of the lead screw 331 and engages with the lead screw 331 for transmission, and the screen fixing member 32 and the sliding block 332 are relatively fixed. In other words, the sliding block 332 is arranged on the lead screw 331, and may move left and right in the length direction of the lead screw 331 (e.g., a direction shown in FIG. 2), and a transmission manner of the sliding block 332 and the lead screw 331 is that the sliding block 332 engages with the lead screw 331 to achieve transmission. Therefore, the lead screw 331 and the sliding block 332 is high in transmission efficiency, relatively simple in manufacturing, and low in maintenance costs, and it is also possible to realize the conversion of the rotary motion of the lead screw 331 into the linear motion of the sliding block 332.

Furthermore, the transmission member 33 may further include a supporting frame 333. The supporting frame 333 has a first supporting plate 3331 and a second supporting plate 3332 that are spaced apart in the length direction of the storage box 1 (e.g., the left-right direction of the storage box shown in FIG. 2). Both ends of the lead screw 331 (e.g., the left end and the right end of the lead screw 331 shown in FIG. 2) are rotatably supported on the first supporting plate 3331 and the second supporting plate 3332, the motor 31 is disposed at an outer side of the first supporting plate 3331 or the second supporting plate 3332 in the length direction of the storage box 1, and the sliding block 332 is located between the first supporting plate 3331 and the second supporting plate 3332. A rectangular connecting plate may be disposed between the first supporting plate 3331 and the second supporting plate 3332 for connection, and the connecting plate may be located below the sliding block.

For example, as shown in FIG. 2, the motor 31 is disposed at a left side of the first supporting plate 3331, the sliding block 332 is located between the first supporting plate 3331 and the second supporting plate 3332, and the first supporting plate 3331 and the second supporting plate 3332 are connected and fixed by a long strip-shaped connecting plate. When the transmission member 33 works, the motor 31 drives the lead screw 331 between the first supporting plate 3331 and the second supporting plate 3332 to rotate, the lead screw 331 engages with the sliding block 332 and drives the sliding block 332 to move, and the sliding block 332 and the screen fixing member 32 are connected, so that the movement of the sliding block 332 drives the screen fixing member 32 to move. Therefore, the transmission member 33 is good in transmission performance, high in transmission efficiency, low in a friction force, simple in manufacturing, low in costs, and convenient in maintenance.

In some embodiments, as shown in FIG. 1, a connection plane 321 is formed on the screen fixing member 32, and the moving end of the flexible screen 22 (e.g., the right end of the flexible screen 22 shown in FIG. 2) is bonded to the connection plane 321. For example, PU foam tape, hot melt adhesive, double-sided tape, etc. may be used to bond the flexible screen 22 and the connection plane 321. Therefore, the flexible screen 22 may be firmly connected to the screen fixing member 32, which reduces the maintenance rate of the display assembly 100 and increases a service life of the display assembly 100.

Further, a sliding part 322 is disposed on the screen fixing member 32, and the screen fixing member 32 is disposed above the storage box 1 along an up-down direction in FIG. 2. Above the storage box 1, the screen fixing member 32 is slidable. Optionally, the sliding part 322 is formed as a sliding groove or a sliding rail, and the sliding part 322 is used for slidably engaging with a side wall of the storage box 1. Therefore, the side wall of the storage box 1 may not only play a role of supporting the screen fixing member 32, and ensure that the screen fixing member 32 may slide smoothly to realize the unfolding and folding of the flexible screen, and simultaneously, also reduce the pressure of the screen fixing member 32 on the sliding block 332, thereby ensuring that the sliding block 332 and the lead screw 331 may be engaged for smooth transmission, and ensuring the smoothness of the transmission process of the transmission member.

Of course, the present application is not limited thereto. The screen fixing member 32 may also be slidably fixed on the center console or at the position of the armrest between the driver seat and the front passenger seat. Specifically, when the screen fixing member 32 is slidably fixed on the center console, the sliding part 322 on the screen fixing member 32 slidably engages with the center console; or when the screen fixing member 32 is slidably fixed at the position of the armrest between the driver seat and the front passenger seat, the sliding part 322 on the screen fixing member slidably engages with the armrest between the driver seat and the front passenger seat.

Figure 3:
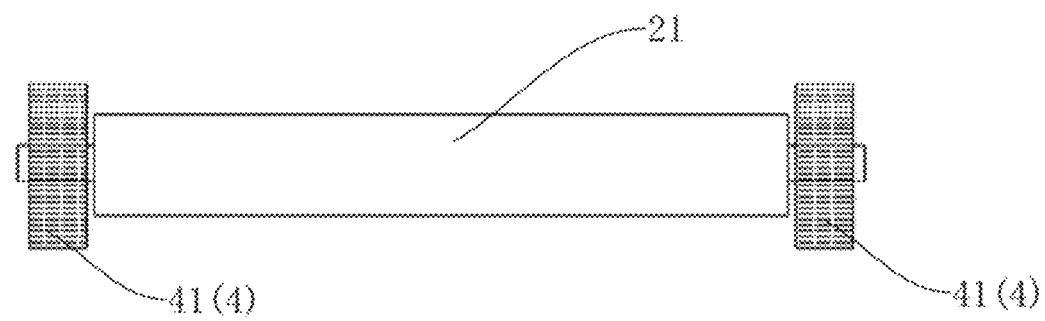
FIG. 3 is a schematic diagram of a front view of a reel and a torsion spring of a display assembly, according to the embodiments of the present application.

Furthermore, as shown in FIG. 3, the screen fixing member 32 further includes a reset member 4. The reset member 4 is connected to the reel 21, and the reset member 4 often has a force that pushes the flexible display screen 2 to switch from the unfolded state to the folded state. The reset member 4 is a torsion spring 41, and the torsion spring 41 is arranged on the reel 21. The torsion spring has a positioning end and a torsion end that are opposite in an axial direction, the positioning end of the torsion spring 41 is fixed, and the torsion end of the torsion spring is connected to the reel 21.

Figure 4:
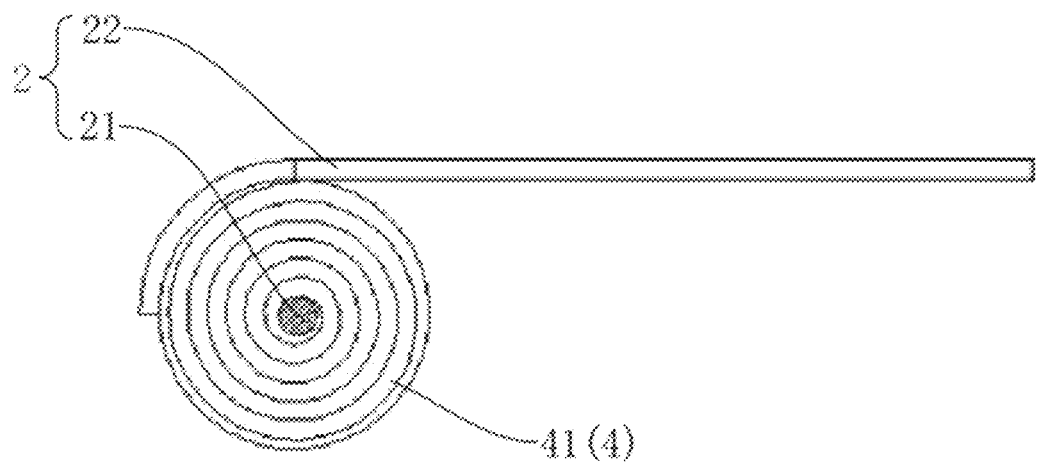
FIG. 4 is a schematic diagram of a side view of a reel and a torsion spring of a display assembly, according to the embodiments of the present application.

Specifically, as shown in FIG. 4, the fixed end of the flexible display screen 2 (e.g., the left end of the flexible display screen 2 shown in FIG. 2) is fixed on the reel 21 by arranging the torsion spring 41 on the reel 21, and the moving end of the flexible display screen 2 (e.g., the right end of the flexible display screen 2 shown in FIG. 2) is fixed on the screen fixing member 32. When the flexible display screen 2 is in the folded state, the torsion spring 41 also has a certain torsion force. When the motor 31 drives the lead screw 331 to rotate, the lead screw 331 drives the sliding block 332 to move, then the sliding block 332 drives the screen fixing member 32 connected to the sliding block 332 to move, and the screen fixing member 32 drives the flexible screen 22 to unfold. As the flexible screen 22 is unfolded, the torsion force of the torsion spring 41 gradually increases, so as to cooperate with the reel 21 to provide a pulling force for the winding of the flexible screen 22. When the flexible screen needs to be retracted, the pulling force may make the flexible display screen 2 automatically retract.

In addition, the display assembly 100 may further include a control button (not shown in figures) for controlling the flexible display screen 2 to switch between the unfolded state and the folded state. Specifically, the control button may be located on a steering wheel, or may also be located on an edge of the storage box 1. By providing the control button, the display assembly 100 may be used more conveniently, and users have good experience.

Further, the flexible display screen 2 of the embodiments of the present application may be a touch flexible display screen. That is, touch operations may be performed on the flexible display screen, and the unfolding and folding of the flexible display screen 2 may be controlled through a touch function of a display device. As a result, good user experience may be obtained, the operation is easy, and target users are wide.

A working principle of the display assembly 100 of the embodiments of the present application will be described in detail below.

When the display assembly 100 works, the storage box 1 may be used to store the item carried by the passenger, and the flexible display screen 2 has the unfolded state and the folded state. When the flexible display screen 2 is in the folded state, the storage groove 11 at the rear of the flexible display screen 2 may be exposed, and in this case, the passenger may put the carried item into the storage groove 11. When the flexible screen 22 needs to be used to display information, the motor 31 is operated by pressing the control button or touching the display screen, the motor 31 drives the lead screw 331 to rotate, the lead screw 331 rotates to drive the sliding block 332 on the lead screw 331 to move, the screen fixing member 32 fixed relatively to the sliding block 332 also moves, the screen fixing member 32 drives the moving end of the flexible screen 22 to move, so that the flexible screen 22 unfolds, and in this case, information may be displayed on the flexible screen 22, and the storage groove 11 is blocked. When the flexible screen 22 is not required to display information or when the item in the storage groove 11 needs to be taken, the reset member 4 is operated by pressing the control button or touching the display screen, the reset member 4 is the torsion spring 41, which often has the force that pushes the flexible display screen 2 to switch from the unfolded state to the folded state, so that the flexible screen 22 is caused to fold, and the open side of the storage groove 11 is exposed, and the user may take the item in the storage groove 11. Thus, the display assembly 100 has a high degree of function integration, a small size and a reasonable design, and it is possible to effectively utilize the space in the vehicle.

A vehicle according to a second aspect of the present application includes the display assembly according to the first aspect of the present application, and the display assembly is disposed in the center console of the vehicle or at the position of the armrest between the driver seat and the front passenger seat.

According to the vehicle of the present application, by providing the display assembly of the first aspect, the function integration is high, the volume is small, the design is reasonable, and the space in the vehicle is able to be effectively utilized.

In the description of the present application, it will be understood that orientations or positional relationships indicated by terms "center", "longitudinal direction", "horizontal direction", "length", "width", "thickness", "upper/up/above", "lower/down/below", "front", "rear", "left", "right", "vertical", "horizontal", "top", "bottom", "inner", "outer", "clockwise", "anticlockwise", "axial direction", "radial direction", "circumferential direction", etc. are based on orientations or positional relationships shown in the drawings, which is merely to facilitate and simplify the description of the present application, but not to indicate or imply that the referred devices or elements must have a particular orientation, or must be constructed or operated in a particular orientation. Therefore they should not be construed as limitations to the present application.

Furthermore, terms such as "first" and "second" are used for descriptive purposes only, and are not to be construed as indicating or implying relative importance or implicitly indicating the number of indicated technical features. Therefore, features defined as "first" and "second" may explicitly or implicitly include one or more of the features. In the description of the present application, "a plurality of/the plurality of/multiple" means two or more unless otherwise specified.

In the present application, unless otherwise specified and restricted, terms "install", "connect/couple", "attach", "fix", etc. are to be understood broadly. For example, it may be a fixed connection, a detachable connection, or an integral connection; it may be a mechanical connection, an electrical connection, or communication; it may be a direct connection, or an indirect connection through an intermediate medium; and it may be internal communication between two elements or interaction between two elements. Specific meanings of the above terms in the present application may be understood by those skilled in the art according to specific situations.

In the description of the description, descriptions of the reference terms "one embodiment", "some embodiments", "examples", "specific examples", or "some examples", etc. are intended to indicate that specific features, structures, materials or characteristics related to the embodiment(s) or the example(s) are included in at least one embodiment or example of the present application. In the description, schematic representations of the above terms do not necessarily refer to the same embodiment or example. In addition, specific features, structures, materials or characteristics may be combined in any one or more embodiments or examples in any suitable manner. In addition, those skilled in the art may combine different embodiments or examples and characteristics of the different embodiments or examples described in the description without mutual contradiction.

Although the embodiments of the present application have been shown and described, a person of ordinary skill in the art may understand that various changes, modifications, substitutions, and variations may be made to these embodiments without departing from the principle and purpose of the present application. The scope of the present application is subject to the claims and their equivalents.

What is claimed is:

1. A display assembly, comprising:
   a storage box, in which a storage groove is formed and a side of the storage groove is open; and
   a flexible display screen, the flexible display screen being able to be switched between an unfolded state and a folded state, and in the unfolded state, the flexible display screen being unfolded and covering an open side of the storage groove; in the folded state, the flexible display screen being folded or wound, and the open side of the storage groove being at least partially exposed;
   wherein the storage box has a first end and a second end that are oppositely disposed, and the flexible display screen includes:
   a reel, the reel being rotatably disposed at the first end of the storage box; and
   a flexible screen that is able to be wound on the reel, the flexible screen having a fixed end and a moving end that are opposite in a length direction thereof, the fixed end of the flexible screen being fixed on the reel, and the moving end of the flexible screen being movable,
   wherein the flexible display screen is in the folded state, and the flexible screen is wound on the reel; the flexible display screen is in the unfolded state, and the moving end of the flexible screen moves to the second end of the storage box.

2. The display assembly according to claim 1, comprising a driving apparatus, the driving apparatus being connected to the flexible display screen for driving the flexible display screen to switch between the unfolded state and the folded state.

3. The display assembly according to claim 2, wherein the driving apparatus includes:
   a motor;
   a screen fixing member, the moving end of the flexible screen being fixed on the screen fixing member; and
   a transmission member, the transmission member being connected to the motor and the screen fixing member, and the motor driving the screen fixing member to move in a straight line through the transmission member.

4. The display assembly according to claim 2, comprising a reset member, the reset member being connected to the reel, and the reset member having a force that pushes the flexible display screen to switch from the unfolded state to the folded state.

5. The display assembly according to claim 3, wherein the transmission member includes:
   a lead screw, the lead screw extending along a direction from the first end of the storage box to the second end of the storage box, and the lead screw being connected to the motor; and
   a sliding block, the sliding block being movably arranged on the lead screw along a length direction of the lead screw and engaging with the lead screw for transmission, and the screen fixing member and the sliding block being relatively fixed.

6. The display assembly according to claim 5, wherein the transmission member further includes a supporting frame, the supporting frame having a first supporting plate and a second supporting plate that are spaced apart in the direction from the first end of the storage box to the second end of the storage box, both ends of the lead screw being rotatably supported on the first supporting plate and the second supporting plate, the motor being disposed at an outer side of the first supporting plate or the second supporting plate in the direction from the first end of the storage box to the second end of the storage box, and the sliding block being located between the first supporting plate and the second supporting plate.

7. The display assembly according to claim 3, wherein a connection plane is formed on the screen fixing member, and the moving end of the flexible screen is bonded to the connection plane.

8. The display assembly according to claim 3, wherein a sliding part is disposed on the screen fixing member, and the screen fixing member is slidable along the direction from the first end of the storage box to the second end of the storage box and disposed at the open side of the storage box.

9. The display assembly according to claim 8, wherein the sliding part is formed as a sliding groove or a sliding rail, and the sliding part slidably engages with a side wall of the storage box.

10. The display assembly according to claim 4, wherein the reset member is a torsion spring, the torsion spring is arranged on the reel, the torsion spring has a positioning end and a torsion end that are opposite in an axial direction of the torsion spring, the positioning end of the torsion spring is fixed, and the torsion end of the torsion spring is connected to the reel.

11. A vehicle, comprising the display assembly according to claim 1, and the display assembly being disposed in a center console or at a position of an armrest between a driver seat and a front passenger seat.

12. The display assembly according to claim 1, wherein the flexible display screen further includes a winding drum, the winding drum is arranged outside the reel, and the reel rotates relative to the winding drum.

13. The display assembly according to claim 12, wherein the winding drum includes an opening extending along an axial direction of the winding drum, and the moving end of the flexible screen extends out of the winding drum from the opening.

14. The display assembly according to claim 12, wherein a distance exists between an inner wall of the winding drum and an outer side of at least a part of the flexible screen in the winding drum.

\* \* \* \* \*